(12) United States Patent
Marui et al.

(10) Patent No.: US 11,664,466 B2
(45) Date of Patent: May 30, 2023

(54) SEMICONDUCTOR DEVICE, POWER MODULE AND METHOD FOR MANUFACTURING THE SEMICONDUCTOR DEVICE

(71) Applicants: NISSAN MOTOR CO., LTD., Yokohama (JP); RENAULT S.A.S., Boulogne-Billancourt (FR)

(72) Inventors: Toshiharu Marui, Kanagawa (JP); Tetsuya Hayashi, Kanagawa (JP); Keiichiro Numakura, Kanagawa (JP); Wei Ni, Kanagawa (JP); Ryota Tanaka, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 0 days.

(21) Appl. No.: 17/263,617

(22) PCT Filed: Aug. 1, 2018

(86) PCT No.: PCT/IB2018/001120
§ 371 (c)(1),
(2) Date: Jan. 27, 2021

(87) PCT Pub. No.: WO2020/025995
PCT Pub. Date: Feb. 6, 2020

(65) Prior Publication Data
US 2021/0296308 A1    Sep. 23, 2021

(51) Int. Cl.
*H01L 29/94* (2006.01)
*H01L 29/66* (2006.01)
(Continued)

(52) U.S. Cl.
CPC ............ *H01L 29/945* (2013.01); *H01L 28/91* (2013.01); *H01L 29/66181* (2013.01); *H01L 25/074* (2013.01)

(58) Field of Classification Search
CPC ... H01L 28/87; H01L 28/91; H01L 29/66181; H01L 29/945; H01L 27/10829–10835; H01L 27/10867; H01L 27/1087
See application file for complete search history.

(56) References Cited

U.S. PATENT DOCUMENTS 6,437,385 B1 *   8/2002   Bertin ............... H01L 27/10861
                                                        257/301
2004/0036051 A1   2/2004   Sneh
(Continued)

FOREIGN PATENT DOCUMENTS

EP    2 924 730 A1    9/2015
JP    60-200565 A    10/1985
(Continued)

*Primary Examiner* — Yu Chen
(74) *Attorney, Agent, or Firm* — Foley & Lardner LLP

(57) ABSTRACT

A semiconductor device includes: a conductive semiconductor substrate in which a trench is formed on the first main surface; a plurality of conductive layers, each of which is either a first conductive layer or a second conductive layer, which are laminated on one another along a surface normal direction of a side surface of the trench; and dielectric layers arranged between a conductive layer closest to the side surface of the trench among the plurality of conductive layers and the side surface of the trench, and between the plurality of corresponding conductive layers. The first conductive layer is electrically insulated from the semiconductor substrate, and the semiconductor substrate that electrically connects to the second conductive layer inside the trench electrically connects to the second electrode.

10 Claims, 16 Drawing Sheets

(51) Int. Cl.
*H01L 49/02* (2006.01)
*H01L 25/07* (2006.01)

(56) References Cited

U.S. PATENT DOCUMENTS

| | | | | |
|---|---|---|---|---|
| 2004/0090734 | A1* | 5/2004 | Lian | H01L 28/91 |
| | | | | 361/306.3 |
| 2004/0228067 | A1* | 11/2004 | Gutsche | H01L 29/945 |
| | | | | 361/306.2 |
| 2007/0274014 | A1 | 11/2007 | Berberich et al. | |
| 2008/0029799 | A1* | 2/2008 | Ahrens | H01L 29/945 |
| | | | | 257/301 |
| 2008/0246069 | A1* | 10/2008 | Dyer | H01L 27/1087 |
| | | | | 257/303 |
| 2008/0291601 | A1 | 11/2008 | Roozeboom et al. | |
| 2012/0012982 | A1* | 1/2012 | Korec | H01L 28/20 |
| | | | | 257/E21.598 |
| 2012/0112349 | A1 | 5/2012 | Kim | |
| 2015/0145103 | A1* | 5/2015 | Chou | H01L 28/92 |
| | | | | 257/534 |
| 2020/0107783 | A1* | 4/2020 | Normand | A61B 5/6867 |

FOREIGN PATENT DOCUMENTS

| | | |
|---|---|---|
| JP | 62-142346 A | 6/1987 |
| JP | 01-179443 A | 7/1989 |
| JP | 2009-515353 A | 4/2009 |

\* cited by examiner

SEMICONDUCTOR DEVICE, POWER MODULE AND METHOD FOR MANUFACTURING THE SEMICONDUCTOR DEVICE

TECHNICAL FIELD

The present invention relates to a semiconductor device including a semiconductor capacitor, a power module, and a method for manufacturing the semiconductor device.

BACKGROUND ART

A configuration in which a capacitor structural body is formed inside a trench formed on a surface of a semiconductor substrate is used for a semiconductor capacitor. For example, a configuration of a capacitor structural body in which conductive layers and dielectric layers are laminated on each other inside a trench is disclosed (see Patent Literature 1).

CITATION LIST

Patent Literature

[PTL 1] Japanese Unexamined Patent Application Publication (Translation of PCT Application) No. 2009-515353

SUMMARY OF INVENTION

Technical Problem

However, the capacitor structural body described in Patent Literature 1 has a configuration in which a part of the conductive layers formed inside the trench is extended to the surface of the semiconductor substrate, and positive and negative electrodes are individually provided on upper surfaces of the conductive layers on the surface of the semiconductor substrate. That is, when electric charges are charged from the electrodes to the conductive layers formed along an inner wall surface of the trench, a path of a current that flows through the conductive layers until the whole of the conductive layers is filled with the electric charges is lengthened. Therefore, in a region where the conductive layers are formed thin inside the trench, there has been a problem that an equivalent series resistance (ESR) between the conductive layers and the electrodes increases.

The present invention has an object to provide a semiconductor device capable of suppressing the increase of the equivalent series resistance in the capacitor structural body formed inside the trench of the semiconductor substrate, a power module, and a method for manufacturing the semiconductor device.

Solution to Problem

A semiconductor device according to an aspect of the present invention includes: a first conductive layer and a second conductive layer, which are laminated on each other with a dielectric layer interposed therebetween inside a trench formed on a first main surface of a conductive semiconductor substrate; a first electrode that electrically connects to the first conductive layer; and a second electrode that electrically connects to the second conductive layer. The first conductive layer is electrically insulated from the semiconductor substrate, and the semiconductor substrate that electrically connects to the second conductive layer inside the trench electrically connects to the second electrode.

A power module according to another aspect of the present invention is constituted by combining, with each other: a semiconductor device in which a capacitor structural body is formed of a first and second conductive layers laminated on each other with a dielectric layer interposed therebetween inside a trench formed on a first main surface of a conductive semiconductor substrate, the semiconductor device including a first electrode that electrically connects to the first conductive layer and a second electrode that electrically connects to the semiconductor substrate; and a power semiconductor element in which a main electrode electrically connects to the first electrode or second electrode of the semiconductor device.

A method for manufacturing a semiconductor device according to another aspect of the present invention includes: laminating a first conductive layer and a second conductive layer on each other with a dielectric layer interposed therebetween inside a trench formed on a first main surface of a conductive semiconductor substrate; and removing the first conductive layer and the dielectric layer, which are formed on a bottom portion of the trench, in order to electrically connect the second conductive layer to the semiconductor substrate at the bottom portion of the trench, wherein the first conductive layer and the dielectric layer, which are formed on the bottom portion of the trench, are removed after a portion of the first main surface, which is outside of the trench, is covered with an insulating protective film.

Advantageous Effects of Invention

In accordance with the present invention, there can be provided the semiconductor device capable of suppressing the increase of the equivalent series resistance in the capacitor structural body formed inside the trench of the semiconductor substrate, the power module, and the method for manufacturing the semiconductor device.

DESCRIPTION OF EMBODIMENTS

Figure 1:
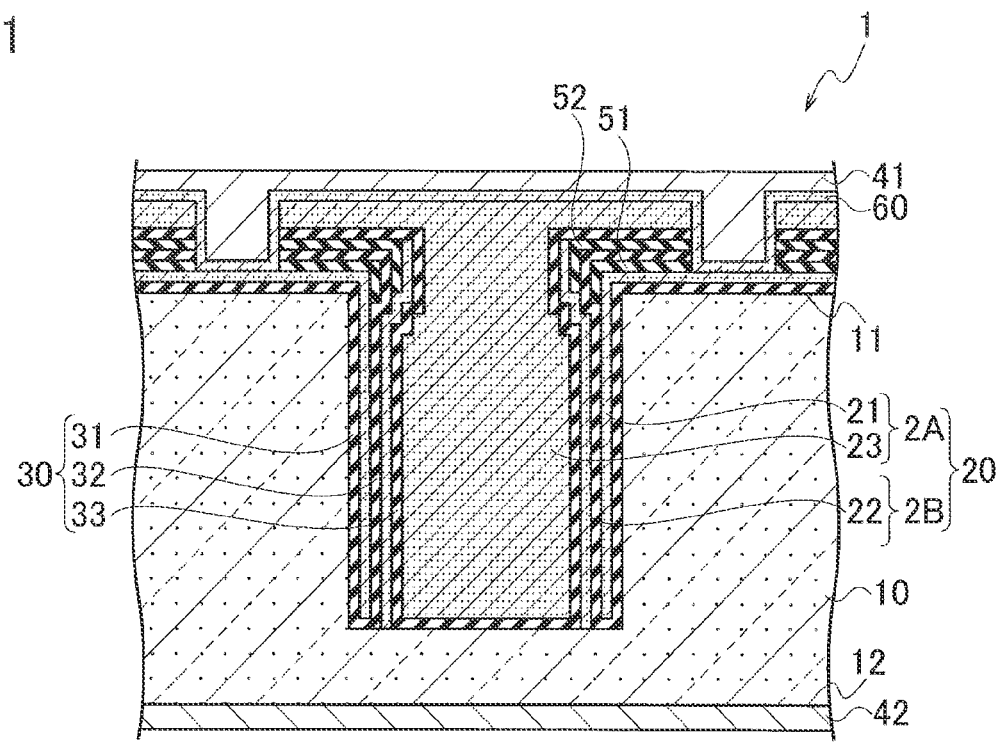
FIG. 1 is a schematic cross-sectional view illustrating a configuration of a semiconductor device according to a first embodiment of the present invention

Hereinafter, a description will be given of embodiments with reference to the drawings. In the description of the drawings, the same reference numerals are assigned to the same portions, and a description thereof is omitted. However, the drawings are schematic, and relationships between thicknesses and plane dimensions, ratios of thicknesses of the respective layers, and the like include portions different from actual ones. Moreover, between the drawings, portions where dimensional relationships and ratios therebetween are different from each other are also included.

First Embodiment

A semiconductor device 1 according to a first embodiment of the present invention, which is illustrated in FIG. 1, includes: a semiconductor substrate 10 which has a first and second main surfaces 11 and 12 facing each other, in which a trench is formed on the first main surface 11; and a plurality of conductive layers laminated along a surface normal direction of a side surface of the trench. FIG. 1 is a cross-sectional view taken along a lateral direction of the trench formed on the first main surface 11.

Each of the plurality of conductive layers arranged inside the trench is either a first conductive layer 2A or a second conductive layer 2B. Hereinafter, the first conductive layer 2A and the second conductive layer 2B will be collectively referred to as "conductive layers 20." In the semiconductor device 1 illustrated in FIG. 1, a conductive layer closest to the side surface of the trench in the conductive layers 20 is defined as a first conductive layer, and odd number-th conductive layers in the conductive layers 20 are the first conductive layers 2A. That is, a conductive layer 21 and a conductive layer 23 are the first conductive layers 2A.

Meanwhile, an even number-th conductive layer in the conductive layers 20 is the second conductive layer 2B. That is, a conductive layer 22 is the second conductive layer 2B.

As illustrated in FIG. 1, between the side surface and the conductive layer, closest to the side surface of the trench in the conductive layers 20, and between the mutual conductive layers 20, dielectric layers 31 to 33 (hereinafter, collectively referred to as "dielectric layers 30") are individually arranged. That is, the dielectric layer 31 is arranged between the side surface of the trench and the conductive layer 21, the dielectric layer 32 is arranged between the conductive layer 21 and the conductive layer 22, and the dielectric layer 33 is arranged between the conductive layer 22 and the conductive layer 23. The first conductive layers 2A, the dielectric layers 30 and the second conductive layer 2B are laminated on one another, whereby a capacitor is configured, The first conductive layers 2A are electrically insulated from the semiconductor substrate 10 by the dielectric layers 30. Meanwhile, the second conductive layer 2B electrically connects to the semiconductor substrate 10 inside the trench. That is, as illustrated in FIG. 1, a lower end of the second conductive layer 2B contacts the semiconductor substrate 10 at a bottom portion of the trench.

The semiconductor device 1 further includes: a first electrode 41 that electrically connects to the first conductive layers 2A; and a second electrode 42 that electrically connects to the second conductive layer 2B. The first electrode 41 and the second electrode 42 are arranged outside the trench.

In the semiconductor device 1 illustrated in FIG. 1, the first electrode 41 is arranged on the first main surface 11 of the semiconductor substrate 10, end the first electrode 41 and the first conductive layers 2A connect to each other outside the trench. That is, a part of the first conductive layers 2A formed inside the trench is extended to the first main surface 11, and the first conductive layers 2A and the first electrode 41 electrically connect to each other on the first main surface 11. On the first main surface 11 of the semiconductor device 1 illustrated in FIG. 1, there are also arranged: the dielectric layers 30 extended from the inside of the trench to the first main surface 11; and an insulating protective film 51 and an insulating protective film 52, which are formed outside the trench. The first electrode 41 connects to the first conductive layers 2A on an opening portion provided in dielectric layers 30, the insulating protective film 51 and the insulating protective film 52. Details of the insulating protective film 51 and the insulating protective film 52 will be described later.

The second electrode 42 is arranged on the second main surface 12 of the semiconductor substrate 10. Since the second conductive layer 2B is electrically connecting to the semiconductor substrate 10 inside the trench, the second electrode 42 electrically connects to the second conductive layer 2B via the conductive semiconductor substrate 10.

Hereinafter, a description will be given of operations of the semiconductor device 1 illustrated in FIG. 1. When a positive voltage is applied to the first electrode 41, and a negative voltage is applied to the second electrode 42, positive electric charges are charged into the first conductive layers 2A, and negative electric charges are charged into a side wall of the trench formed in the semiconductor substrate 10 and into the second conductive layer 2B. Then, polarization occurs inside the dielectric layers 30, and an electrostatic capacity is generated. At this time, the conductive layer 21 and the conductive layer 23, which are the first conductive layers 2A, electrically connect to each other, and the conductive layer 22 that is the second conductive layer 2B and the semiconductor substrate 10 electrically connect to each other. Hence, the semiconductor device 1 has a configuration in which three capacitors having the dielectric layer 31, the dielectric layer 32 and the dielectric layer 33 are connected in parallel to one another. As described above, in accordance with the semiconductor device 1 illustrated in FIG. 1, a capacitor structural body in which a capacity density per unit area is improved greatly can be achieved.

Moreover, in accordance with the semiconductor device 1, an equivalent series resistance (ESR) of the capacitor structural body can be reduced. Hereinafter, in comparison with a semiconductor device of a comparative example, which is illustrated in FIG. 2, the reduction of the ESR by the semiconductor device 1 will be described.

Figure 2:
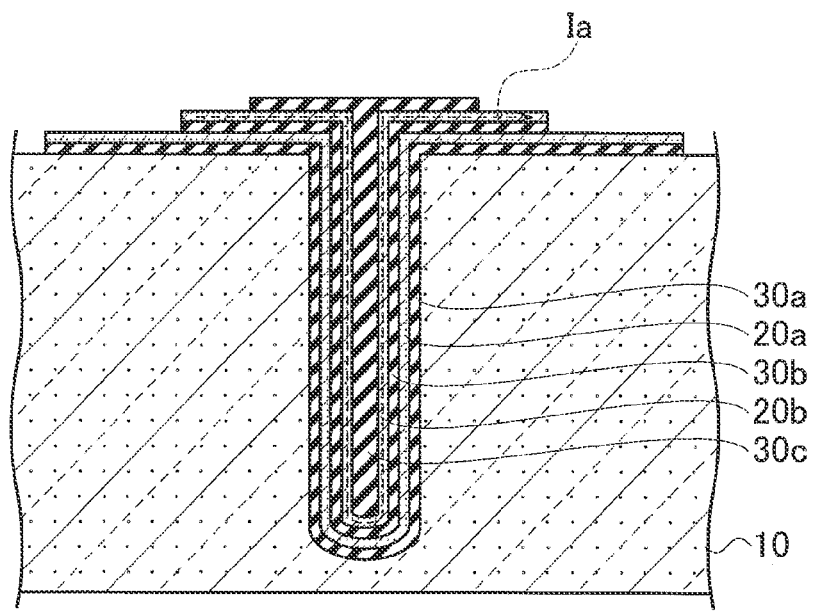
FIG. 2 is a schematic cross-sectional view illustrating a configuration of a semiconductor device of a comparative example.

The semiconductor device illustrated in FIG. 2 has a structure in which a conductive layer 20a and a conductive layer 20b are laminated on each other inside a trench formed in the first main surface 11 of the conductive semiconductor substrate 10. A dielectric layer 30a is arranged between the side surface of the trench and the conductive layer 20a, and a dielectric layer 30b is arranged between the conductive layer 20a and the conductive layer 20b. Then, a remaining region of the trench is embedded with the dielectric layer 30c. As described above, the semiconductor device illustrated in FIG. 2 has a configuration in which a capacitor structural body having conductive layers and dielectric layers laminated alternately with one another is formed in the trench formed on the first main surface 11 of the semiconductor substrate 10. Note that end portions of the conductive layer 20a and the conductive layer 20b are extended on the main surface of the semiconductor substrate 10, in which the trench is formed.

In the semiconductor device of the comparative example, which is illustrated In FIG. 2, for example, in order to charge electric charges into the conductive layer 20b, it is necessary to flow a current Ia between both end portions of the conductive layer 20b, which are arranged on the main surface of the semiconductor substrate 10, as a current path thereof is illustrated by a dashed arrow. That is, it is necessary to flow a current to the conductive layer inside the trench with a distance twice or more a depth of the trench. Since there is a limit to increasing a film thickness of the conductive layer arranged on the side surface of the trench, ESR of the semiconductor device of the comparative example, which is illustrated in FIG. 2, is large.

Figure 3:
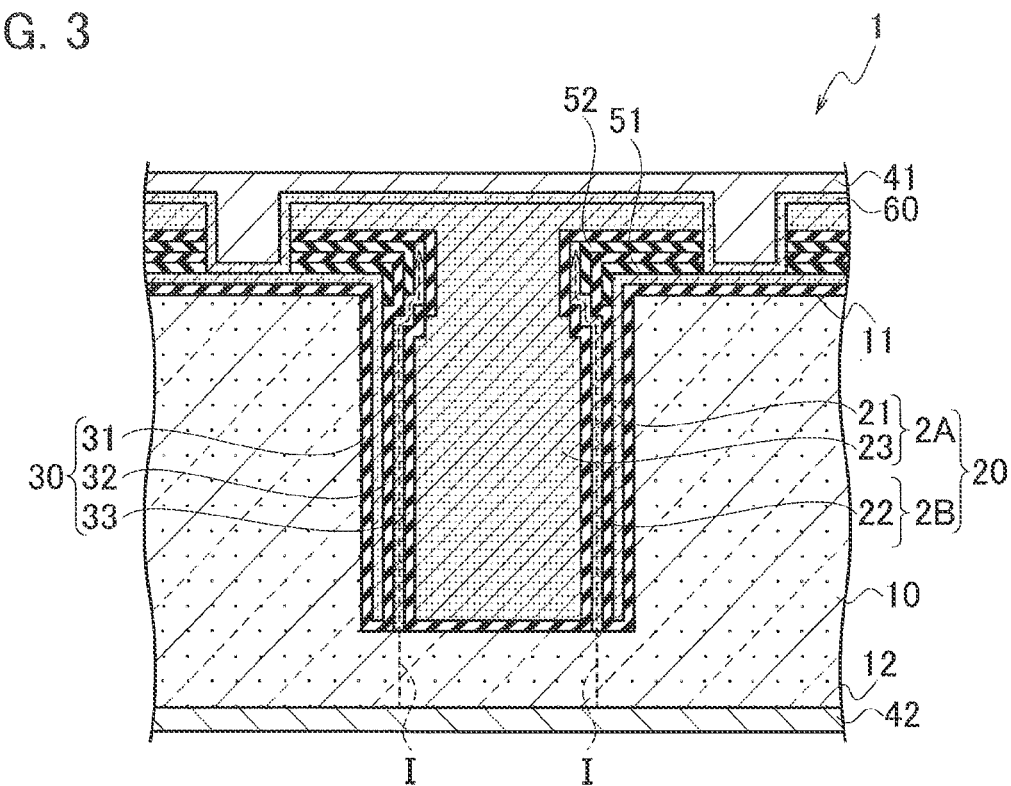
FIG. 3 is a schematic cross-sectional view for explaining a current path of the semiconductor device according to the first embodiment of the present invention.

In contrast, in the semiconductor device 1 illustrated in FIG. 1, the second conductive layer 2B and the semiconductor substrate 10 are electrically connecting to each other at the bottom portion of the trench. Therefore, in order to charge negative electric charges into the second conductive layer 2B, a transient current I just needs to be flown from the second electrode 42, which is arranged on the second main surface 12, to an upper end of the second conductive layer 2B as a current path thereof is illustrated by broken lines in FIG. 3. That is, in comparison with the current path of the semiconductor device of the comparative example, which is illustrated in FIG. 2, the current path of the semiconductor device 1 is linear and extremely short, and can reduce the ESR.

Hereinafter, a method for manufacturing the semiconductor device 1 according to the first embodiment of the present invention will be described with reference to the drawings. Note that the method for manufacturing the semiconductor device 1, which will be mentioned below, is merely an example, and the semiconductor device is achievable by a variety of manufacturing methods other than this mentioned method, the manufacturing methods including modified examples thereof.

First, the trench is formed on the first, main surface 11 of the semiconductor substrate 10 having conductivity. For the semiconductor substrate 10, a silicon substrate with a high impurity concentration, in which a resistivity is, for example, approximately 1E-4 to 1E-5 $\Omega\text{cm}^2$, or the like is used. The semiconductor substrate 10 may be either a p-type semiconductor substrate or an n-type semiconductor substrate.

Figure 4:
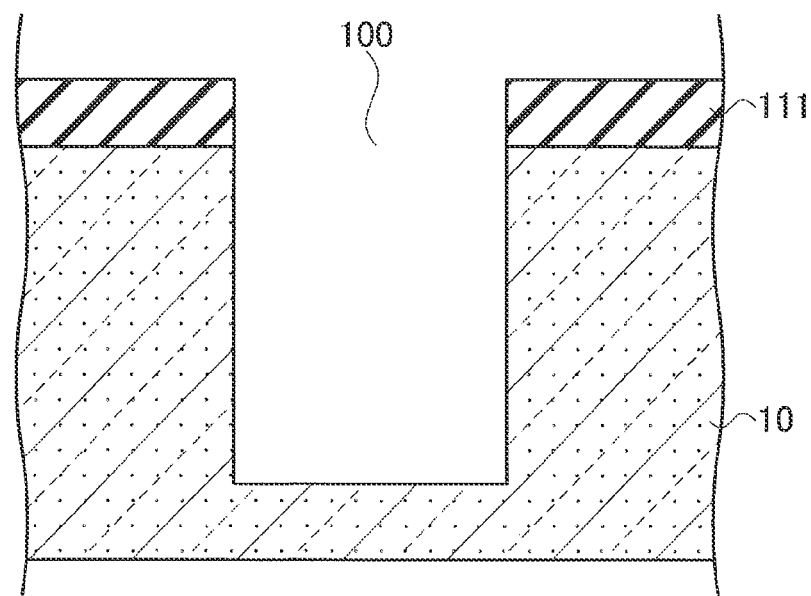
FIG. 4 is a schematic cross-sectional view for explaining a method for manufacturing the semiconductor device according to the first embodiment of the present invention (No. 1).

For example, as illustrated in FIG. 4, a trench 100 is formed on the first main surface 11 by using, as an etching mask, a mask material 111 formed on the first main surface 11 of: the semiconductor substrate 10. That is, after the mask material 111 is formed on the entire surface of the first main surface 11, the mask material 111 is patterned so that a region on which the trench 100 is to be formed is exposed. Then, the first main surface 11 of the semiconductor substrate 10 is etched by dry etching using the mask material 111 as an etching mask, and the trench 100 is formed.

Note that, for example, the following process is used for patterning the mask material 111. That is, a silicon oxide film is formed as the mask material 111 by using a thermal CVD method or a plasma CVD method. Then, a photoresist film is arranged on the mask material 111 (not shown). By using, as an etching mask, the photoresist film patterned by a photolithography technology, the mask material 111 is etched by using wet etching using hydrofluoric acid or dry etching such as reactive ion etching. Thereafter, the photoresist film is removed by oxygen plasma, sulfuric acid or the like, whereby the patterning of the mask material 111 is completed.

Figure 5:
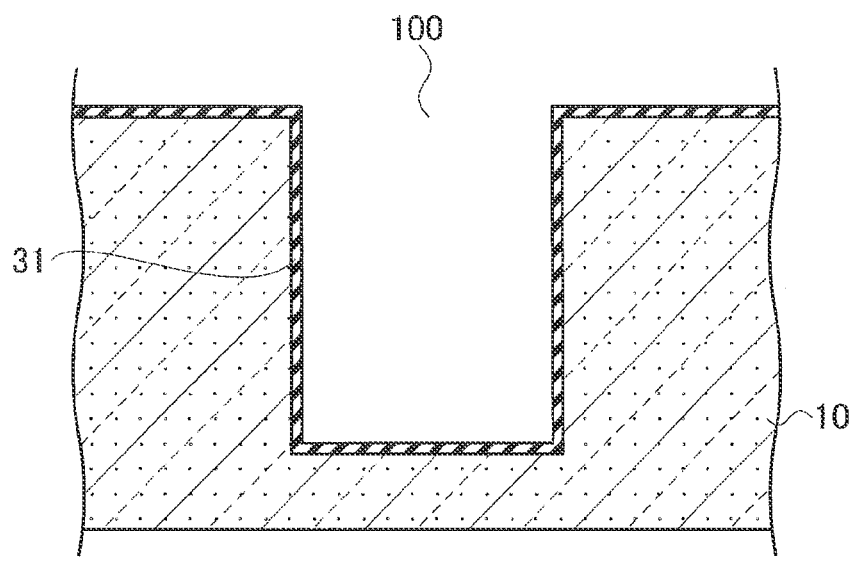
FIG. 5 is a schematic cross-sectional view for explaining the method for manufacturing the semiconductor device according to the first embodiment of the present invention (No. 2).

After the mask material 111 is removed, as illustrated in FIG. 5, the dielectric layer 31 is formed on the surface of the semiconductor substrate 10. For example, a silicon oxide film is used for the dielectric layer 31. In that case, a thermal oxidation method or a thermal CVD method can be used as a forming method of the silicon oxide film. Note that use of the thermal CVD method under a reduced pressure condition makes it possible to form the silicon oxide film with good coverage even if the trench 100 is deep.

Figure 6:
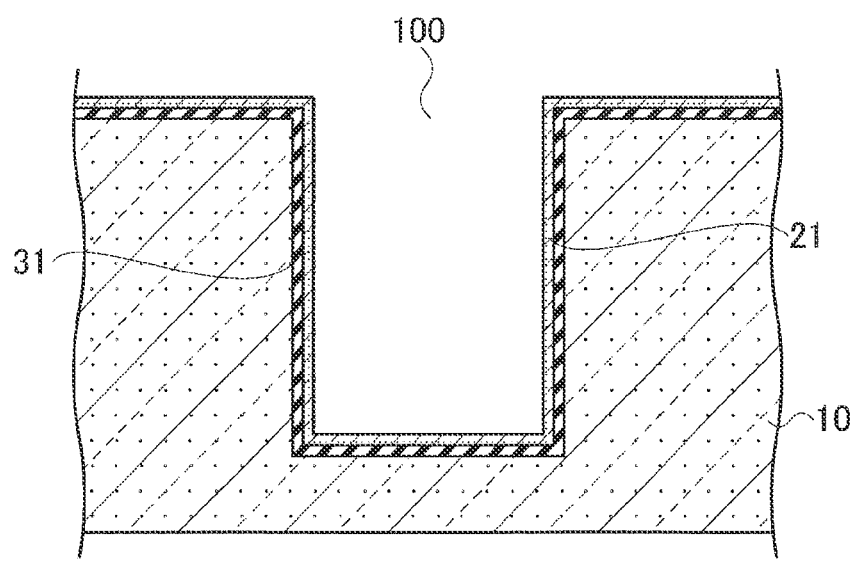
FIG. 6 is a schematic cross-sectional view for explaining the method for manufacturing the semiconductor device according to the first embodiment of the present invention (No. 3).

Subsequently, as illustrated in FIG. 6, the conductive layer 21 is formed so as to cover the dielectric layer 31. For example, polycrystalline silicon films can be used for the conductive layers 20 such as the conductive layer 21. A reduced pressure CVD method or the like can be used for forming the polycrystalline silicon film. Note that, after the polycrystalline silicon film is formed, annealing treatment at 950° C. is performed in phosphorus oxychloride (POCl$_3$), whereby an n-type polycrystalline silicon film is formed, thus making it possible to impart conductivity to the conductive layers 20.

Figure 7:
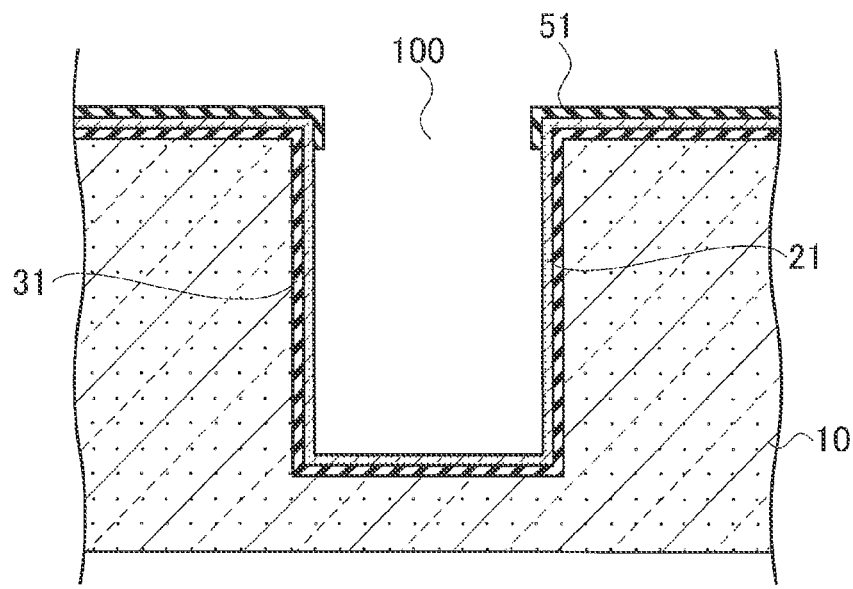
FIG. 7 is a schematic cross-sectional view for explaining the method for manufacturing the semiconductor device according to the first embodiment of the present invention (No. 4).

Thereafter, as illustrated in FIG. 7, the insulating protective film 51 is formed on the first main surface 11 so as to cover the conductive layer 21 formed outside the trench 100. The insulating protective film 51 is formed for the purpose of protecting the conductive layer 21 formed outside the trench 100 in a subsequent etching step. For the insulating protective film 51, for example, a silicon oxide film formed by using the plasma CVD method or the thermal CVD can be used.

Figure 8:
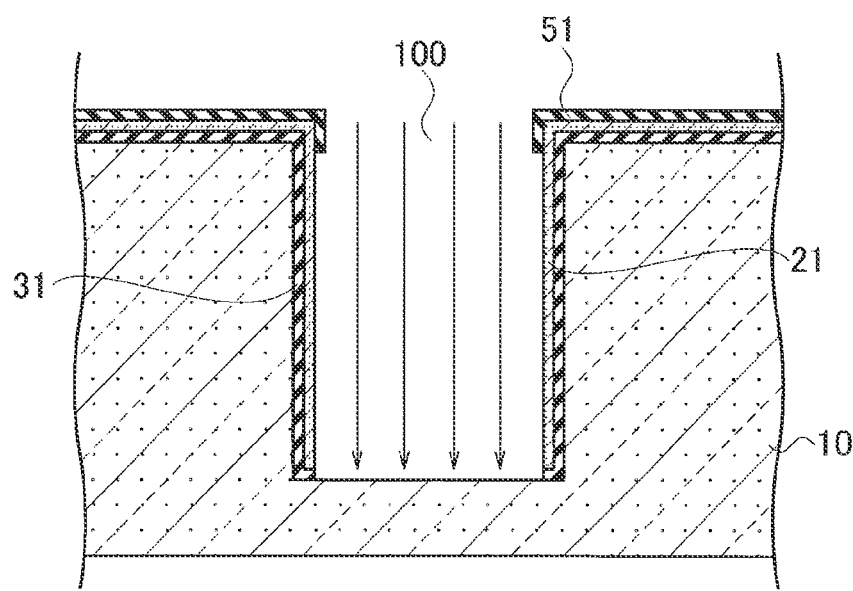
FIG. 8 is a schematic cross-sectional view for explaining the method for manufacturing the semiconductor device according to the first embodiment of the present invention (No. 5).

Next, as illustrated in FIG. 8, the dielectric layer 31 and the conductive layer 21, which are formed on the bottom portion of the trench 100, are selectively removed by dry etching, and the semiconductor substrate 10 is exposed on the bottom portion of the trench 100. At this time, directivity is imparted to an etching direction, whereby the dielectric layer 31 and the conductive layer 21, which are formed on the side surface of the trench 100, can be suppressed from being etched.

Figure 9:
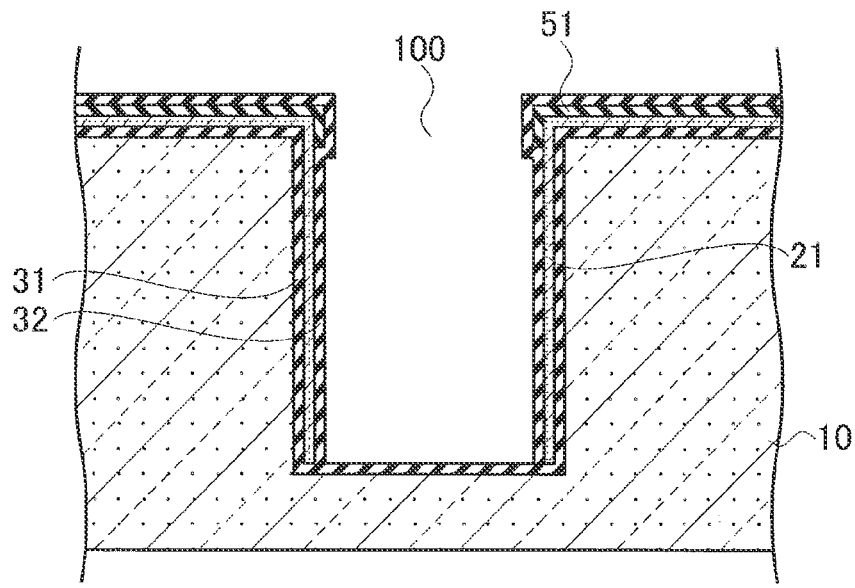
FIG. 9 is a schematic cross-sectional view for explaining the method for manufacturing the semiconductor device according to the first embodiment of the present invention (No. 6).

Next, as illustrated in FIG. 9, the dielectric layer 32 is formed so as to cover the surface of the semiconductor substrate 10. For example, a silicon oxide film is formed as the dielectric layer 32 by using the thermal oxidation method or the thermal CVD method.

Figure 10:
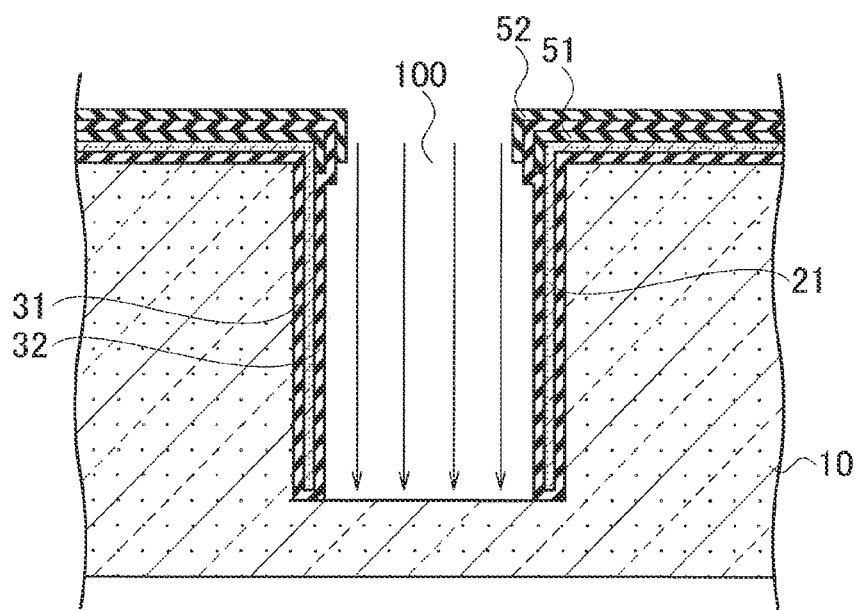
FIG. 10 is a schematic cross-sectional view for explaining the method for manufacturing the semiconductor device according to the first embodiment of the present invention (No. 7).

Thereafter, after the insulating protective film 52 is formed so as to cover the dielectric layer 32 formed outside the trench 100, the dielectric layer 32 formed on the bottom portion of the trench 100 is selectively removed by dry etching as illustrated in FIG. 10. Thus, the semiconductor substrate 10 is exposed on the bottom portion of the trench 100. The insulating protective film 52 is formed for the purpose of protecting the dielectric layer 32 formed outside the trench 100 in this etching step. For the insulating protective film 52, a silicon oxide film or the like can be used like the insulating protective film 51.

Figure 11:
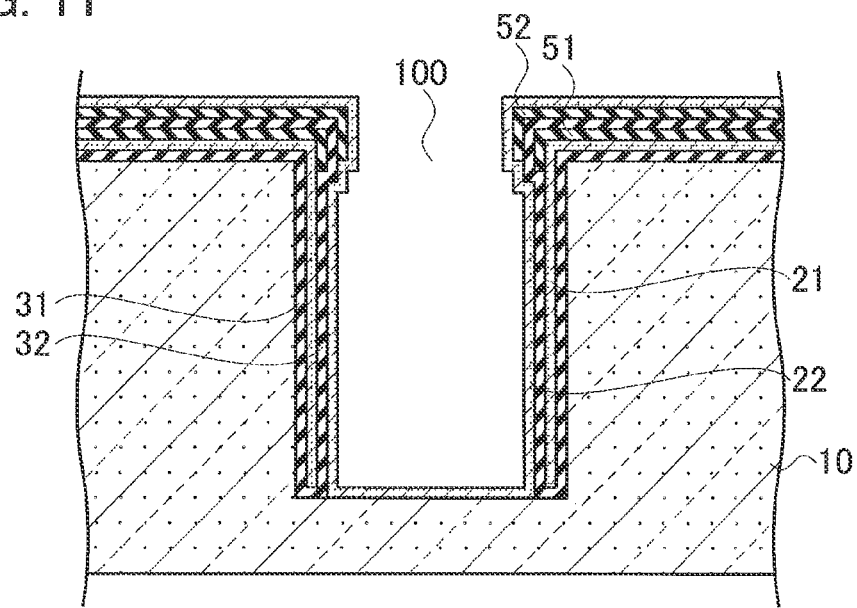
FIG. 11 is a schematic cross-sectional view for explaining the method for manufacturing the semiconductor device according to the first embodiment of the present invention (No. 8).

Next, as illustrated in FIG. 11, the conductive layer 22 is formed so as to cover the dielectric layer 32. For the conductive layer 22, a polycrystalline silicon film or the like can be used like the conductive layer 21. Since the semiconductor substrate 10 is exposed on the bottom portion of the trench 100, the conductive layer 22 and the semiconductor substrate 10 electrically connect to each other at the bottom portion of the trench 100.

Figure 12:
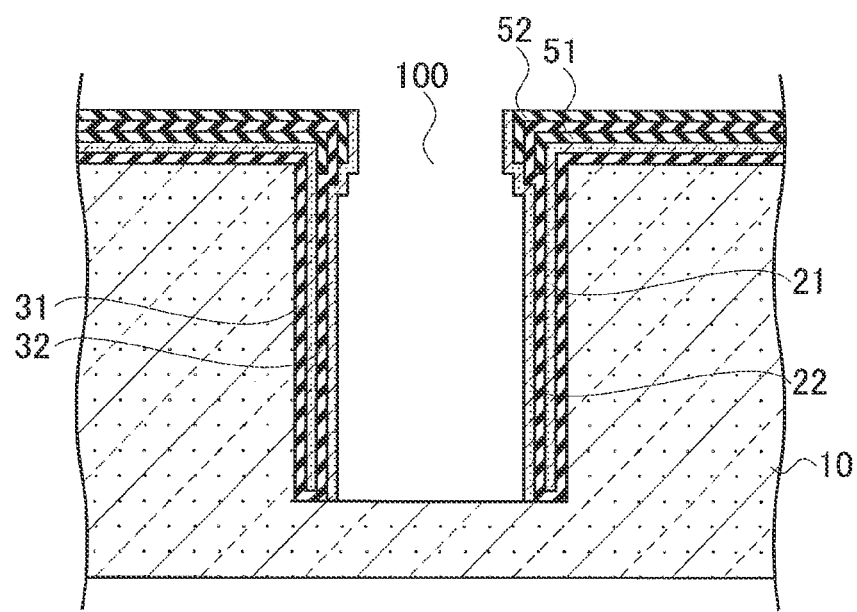
FIG. 12 is a schematic cross-sectional view for explaining the method for manufacturing the semiconductor device according to the first embodiment of the present invention (No. 9).

Subsequently, as illustrated in FIG. 12, the conductive layer 22 formed outside the trench 100 and on the bottom portion of the trench 100 is selectively removed by dry etching. Note that, though it is necessary to prevent the conductive layer 22, which is formed outside the trench 100 on the first main surface 11, from remaining, the conductive layer 22 may remain on the bottom portion of the trench 100. Directivity is imparted to an etching direction in this etching step of the conductive layer 22, whereby the etching of the conductive layer 22 formed on the side surface of the trench 100 can be suppressed.

Figure 13:
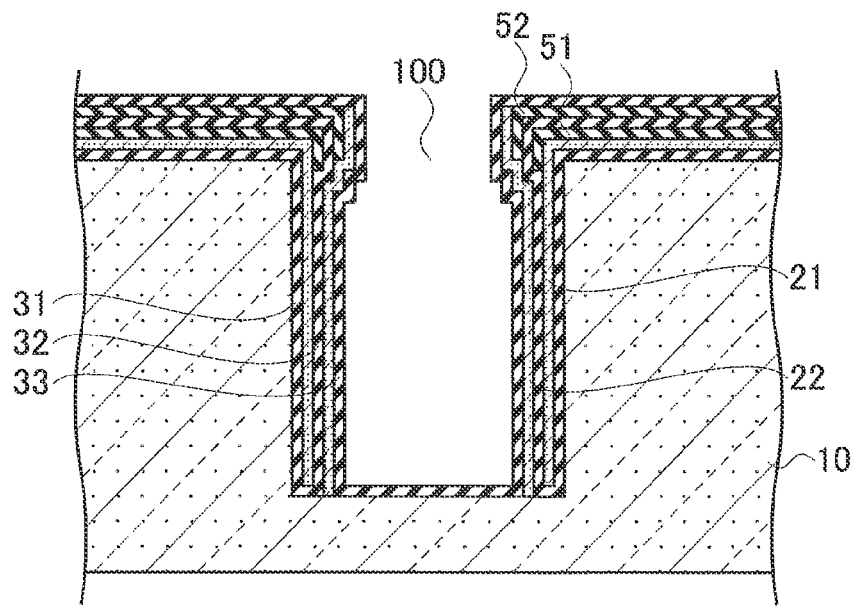
FIG. 13 is a schematic cross-sectional view for explaining the method for manufacturing the semiconductor device according to the first embodiment of the present invention (No. 10).

Next, as illustrated in FIG. 13, the dielectric layer 33 is formed so as to cover the surface of the semiconductor substrate 10. For example, a silicon oxide film or the like can be used for the dielectric layer 33.

Figure 14:
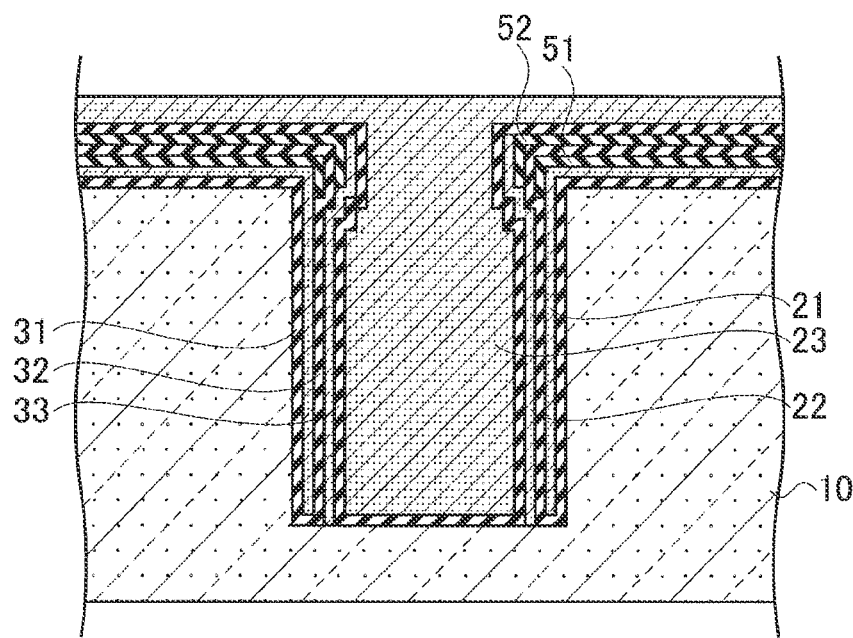
FIG. 14 is a schematic cross-sectional view for explaining the method for manufacturing the semiconductor device according to the first embodiment of the present invention (No. 11).

Thereafter, as illustrated in FIG. 14, the conductive layer 23 is formed so as to embed the trench 100 therewith. For the conductive layer 23, a polycrystalline silicon film or the like can be used like the conductive layer 21 and the conductive layer 22.

Figure 15:
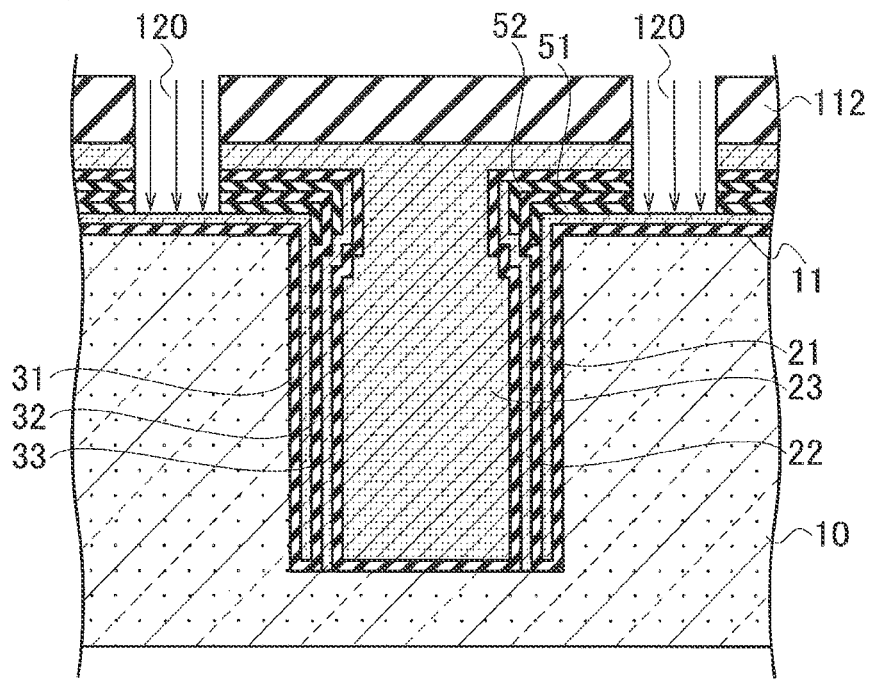
FIG. 15 is a schematic cross-sectional view for explaining the method for manufacturing the semiconductor device according to the first embodiment of the present invention (No. 12).
Figure 16:
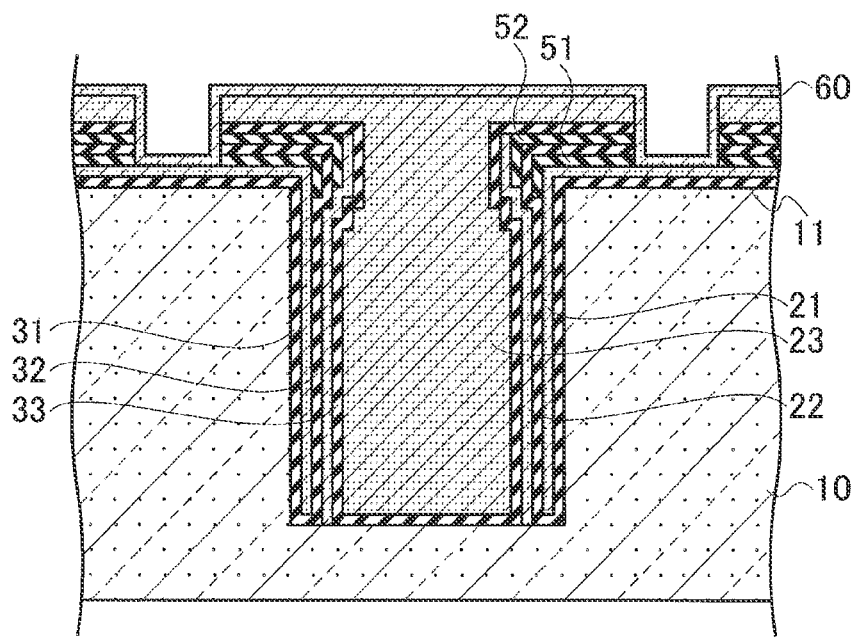
FIG. 16 is a schematic cross-sectional view for explaining the method for manufacturing the semiconductor device according to the first embodiment of the present invention (No. 13).

Subsequently, a part of the conductive layer 21 is exposed on predetermined positions outside the trench 100 on the first main surface 11. That is, as illustrated in FIG. 15, contact holes 120 penetrating the insulating protective film 51, the dielectric layer 32, the insulating protective film 52, the dielectric layer 33 and the conductive layer 23, which are formed on the first main surface 11, are formed by using the mask material 112 as an etching mask. For example, a photoresist film is used for the mask material 112, and the mask material 112 is patterned by using the photolithography technology. Then, the contact holes 120 are formed by dry etching, After the mask material 112 is removed, as illustrated in FIG. 16, a conductive contact film 60 arranged inside the contact holes 120 is formed on the first main surface 11 of the semiconductor substrate 10. By the contact film 60, electrical connection between the conductive layer 21, the conductive layer 23 and the first electrode 41 can be surely made. For the contact film 60, a polycrystalline silicon film or the like can be used.

Thereafter, the first electrode 41 is formed on the first main surface 11 so as to cover the contact film 60, and the second electrode 42 is formed on the second main surface 12. In such a way as described above, the semiconductor device illustrated in FIG. 1 is completed.

Note that metal is generally used as a material of the first electrode 41 an the second electrode 42. For example, a metal material such as titanium (Ti), nickel. (Ni), and molybdenum (Mo) and a laminated film of titanium/nickel/silver (Ti/Ni/Ag) can be used for the first electrode 41 and the second electrode 42. The first electrode 41 and the second electrode 42 are formed, for example, by etching metal films. That is, after the metal films are formed by a sputtering method, an electron beam (EB) evaporation method or the like, the metal films are etched by dry etching using a mask material formed by using the photolithography technology, and the first electrode 41 and the second electrode 42 are formed.

In the above-described manufacturing method, as illustrated in FIG. 8 and FIG. 10, after the outside of the trench 100 is covered with the insulating protective film 51 and the insulating protective film 52, the conductive layers 20 and the dielectric layers 30, which are formed on the bottom portion of the trench 100, are removed by etching. Therefore, the conductive layers 20 and the dielectric layers 30, which are formed outside the trench 100 on the first main surface 11 and do not need to be removed, are protected. Thus, the conductive layers 20 formed outside the trench 100 can be used for wiring on the surface of the semiconductor substrate 10.

Moreover, as illustrated in FIG. 8 and FIG. 10, the insulating protective film 51 and the insulating protective film 52 may be formed so that end portions thereof have a shape protruding inward from the side surface of the trench 100 in the opening portion of the trench 100. Thus, in a step of removing the conductive layers 20 and the dielectric layers 30, which are formed on the bottom portion of the trench 100 by etching using plasma, the conductive layers 20 and the dielectric layers 30, which are formed on the side surface of the trench 100, can be protected even if the trench 100 is deep. Note that, when the conductive layers 20 are polycrystalline silicon films, the conductive layers 20 are formed by the reduced pressure CVD method or the like. In this case, the polycrystalline silicon film is formed from the side surface of the trench 100, the conductive layers 20 can be formed easily even if the insulating protective film 51 and the insulating protective film 52 have such a shape that protrudes inward in the opening portion of the trench 100.

In the semiconductor device 1, the respective layers of the first conductive layer 2A and the first electrode 41 can be surely connected to each other by the contact film 60 arranged inside the contact holes 120. For example, when the number of layers increases and the contact holes 120 become deep, it may be sometimes difficult to completely embed the contact holes 120 depending on the material for use in the first electrode 41. However, the contact film 60 is formed inside the contact holes 120, whereby the respective layers of the first conductive layer 2A and the first electrode 41 electrically connect to each other on the first main surface 11. However, when the number of layers of the conductive layers 20 and the dielectric layers 30 is small, and the contact holes 120 have a depth that allows the contact holes 120 to be surely embedded with the first electrode 41, the contact film 60 does not have to be formed.

For example, a single crystal silicon substrate can be used for the semiconductor substrate 10. Thus, it is easy to manufacture the semiconductor device 1 by applying a general semiconductor process, Moreover, high-quality silicon oxide films generated by oxidizing the semiconductor substrate 10 can be formed as the dielectric layers 30 on the entire surface of the semiconductor substrate 10 with high uniformity. Moreover, a polycrystalline silicon substrate may be used for the semiconductor substrate 10. Thus, cost of the semiconductor substrate 10 can be reduced.

In the above, the exemplary description is given of the case where the dielectric layers 30 are silicon oxide films. However, other materials than the silicon oxide films may be used for the dielectric layers 30. For example, silicon nitride films may be used for the dielectric layers 30. The silicon oxide films or the silicon nitride films, which are generally used in the semiconductor process, are used for the dielectric layers 30, whereby high-quality dielectric layers can be formed.

Alternatively, the dielectric layers 30 may have a structure in which a plurality of dielectric films made of different materials are laminated on one another. For example, dielectric films in which distortion directions by a stress are different from one another are laminated on one another to form the dielectric layer 30, whereby a distortion of the whole of the dielectric layers 30 due to a stress can be suppressed. Moreover, dielectric films each having a large breakdown electric field and dielectric films each having a lower breakdown electric field than the above but a high dielectric constant are laminated on one another to form the dielectric layers 30, whereby a balance between a breakdown electric field and dielectric constant of the whole of the dielectric layers 30 can be set to an optimum value corresponding to characteristics required for the capacitor structural body. For example, the dielectric layers 30 may be formed to have a laminated structure including silicon nitride films and silicon oxide films.

In the above, the exemplary description is given of the case where the total number of conductive layers 20 is three. However, the number of conductive layers 20 laminated inside the trench of the semiconductor substrate 10 is not limited to three. For example, each of the first conductive layers 2A and the second conductive layer 2B may be a single layer. Thus, a manufacturing process can be shortened. Meanwhile, as the number of conductive layers 20 to be laminated is larger, the capacity density per unit area can be increased more. Therefore, the total number of conductive layers 20 may be four or more.

Moreover, in the semiconductor device 1 illustrated in FIG. 1, the conductive layer closest to the side surface of the trench is defined as the first conductive layer, the odd number-th first conductive layers 2A electrically connect to each other, and the even number-th second conductive layers 2B electrically connect to each other. The first conductive layers 2A and the second conductive layer 2B are laminated alternately with one another with the dielectric layers 30 interposed therebetween, the capacity density per unit area can be maximized.

Note that, by embedding the trench 100 with the laminated structure of the conductive layers 20 and the dielectric layers 30 without gaps, a cross-sectional area of the conductive layers 20 increases more in comparison with the case where the number of layers in the laminated structure is the same and the trench 100 is not embedded. Thus, the ESR of the capacitor structural body can be reduced.

As described above, in the semiconductor device 1 according to the first embodiment of the present invention, the second conductive layer 2B and the conductive semiconductor substrate 10 electrically connect to each other inside the trench, and the second electrode 42 that electrically connects to the semiconductor substrate 10 is arranged on the second main surface 12. Therefore, electric charges are charged into the second conductive layer 2B by a short current path passing through the semiconductor substrate 10. Therefore, the ESR of the capacitor structural body can be reduced.

Figure 17:
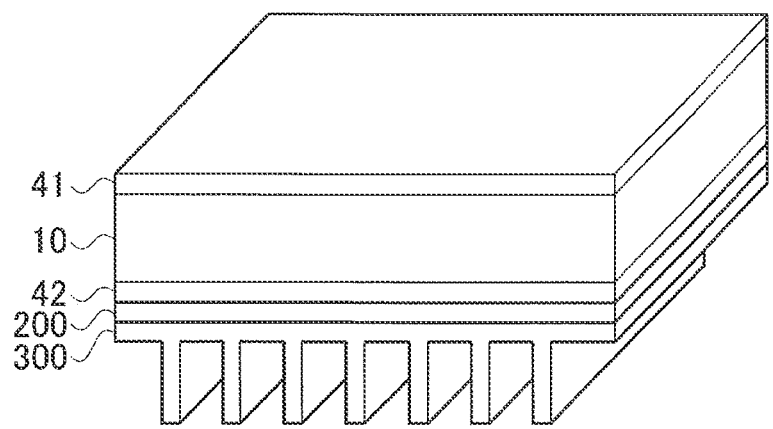
FIG. 17 is a schematic perspective view illustrating a configuration in which a cooling device of the semiconductor device according to the first embodiment of the present invention is arranged.
Figure 18:
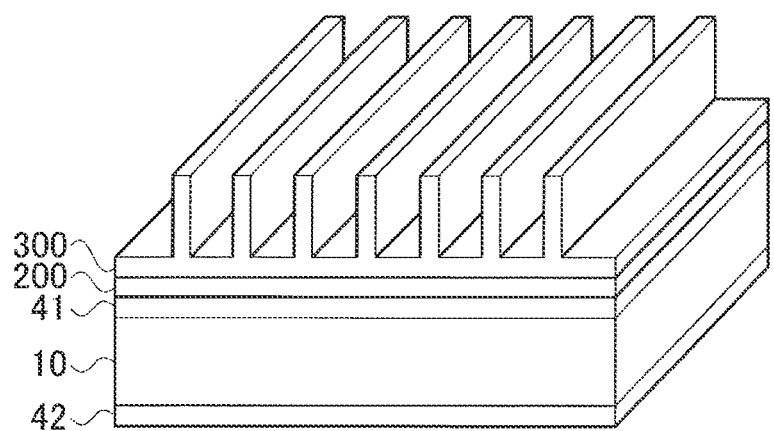
FIG. 18 is a schematic perspective view illustrating another configuration in which the cooling device of the semiconductor device according to the first embodiment of the present invention is arranged.

Note that a cooling device that cools the semiconductor device 1 may be arranged so as to face at least either the first main surface 11 and second main surface 12 of the semiconductor substrate 10. FIG. 17 is an example where a cooling device 300 is arranged toward the second main surface 12 of the semiconductor substrate 10 while interposing an insulator 200 therebetween, the insulator 200 being arranged between the second electrode 42 and the cooling device 300. Moreover, FIG. 18 is an example where the cooling device 300 is arranged toward the first main surface 11 of the semiconductor substrate 10 while interposing the insulator 200 therebetween, the insulator 200 being arranged between the first electrode 41 and the cooling device 300. The cooling device 300 is arranged so as to face the first main surface 11 or second main surface 12 of the semiconductor substrate 10, whereby the increase of the ESR of the capacitor structural body, the increase being caused by a temperature rise of the conductive layers 20, and the like, can be suppressed. For the cooling device 300, for example, a cooling fin using a highly thermal conductive material such as aluminum, and the like can be used.

Figure 19:
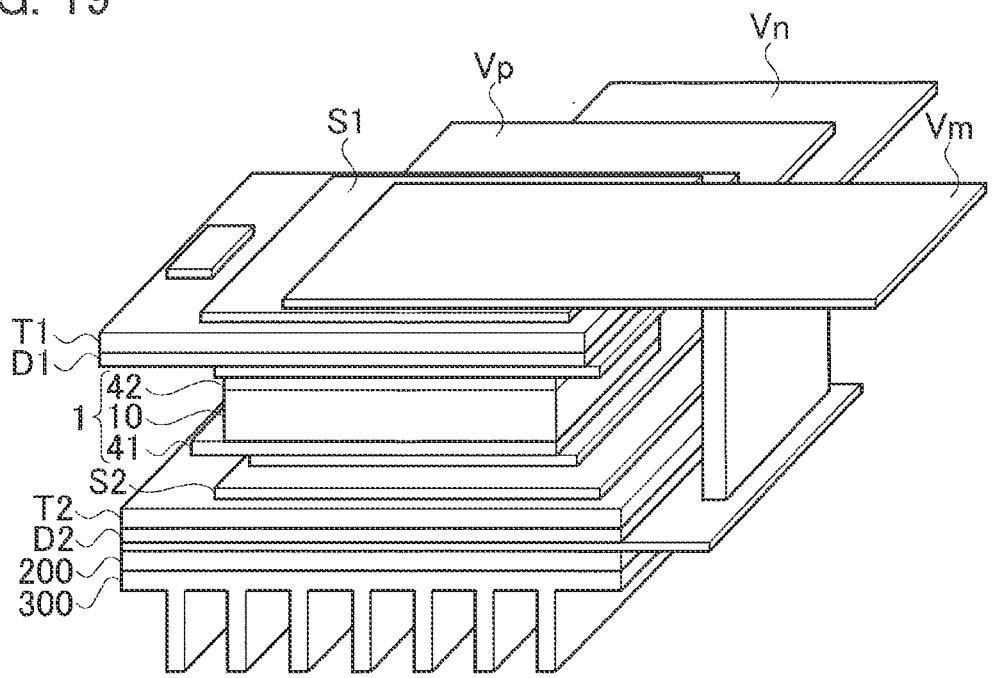
FIG. 19 is a schematic perspective view illustrating an example of a power module using the semiconductor device according to the first embodiment of the present invention.

Moreover, the semiconductor device 1 can constitute a power module by being combined with a power semiconductor element. FIG. 19 illustrates an example of constituting a power module by the semiconductor device 1 and a first power semiconductor element T1 and a second power semiconductor element T2. A drain electrode D1 of the first power semiconductor element T1 connects to the second electrode 42 of the semiconductor device 1, and a source electrode S2 of the second power semiconductor element T2 connects to the first electrode 41, Then, a source electrode S1 of the first power semiconductor element T1 and a drain electrode D2 of the second power semiconductor element T2 electrically connect to each other.

Figure 20:
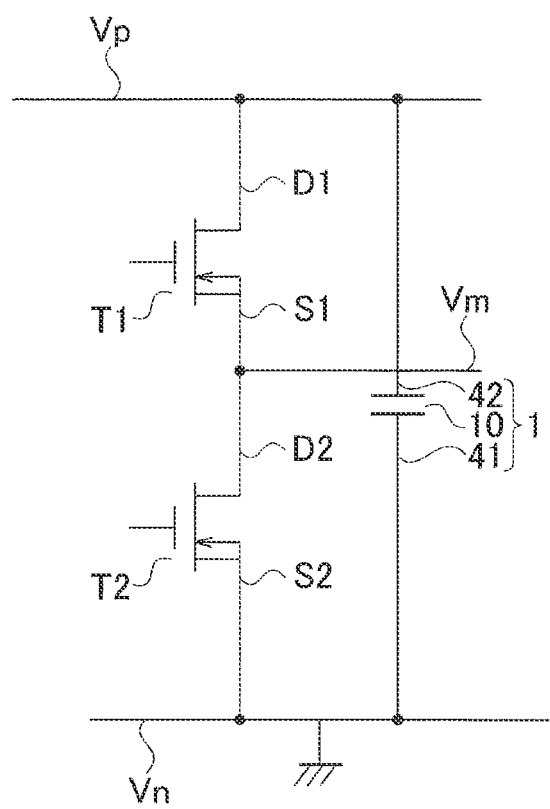
FIG. 20 is a circuit diagram of the power module illustrated in FIG. 19.

The first power semiconductor element T1 and the second power semiconductor element T2 are, fox example, MOS transistors. FIG. 20 illustrates a circuit diagram of a power module composed of the semiconductor device 1, the first power semiconductor element T1 and the second power semiconductor element T2, which are illustrated in FIG. 19. This power module operates as an inverter module as below.

That is, the first power semiconductor element T1 in an upper arm of an inverter is arranged on the second electrode 42 of the semiconductor device 1, and the drain electrode D1 of the first power semiconductor element T1 and the second electrode 42 are electrically connected to each other. Then, the second power semiconductor element T2 in a lower arm of the inverter is arranged on the first electrode 41, and the source electrode S2 of the second power semiconductor element T2 and the first electrode 41 are electrically connected to each other. The source electrode S1 of the first power semiconductor element T1 in the upper arm and the drain electrode D2 of the second power semiconductor element T2 in the lower arm electrically connect to each other an intermediate electrode Vm. A positive potential is applied to a positive electrode Vp where the drain electrode D1 of the first power semiconductor element T1 and the second electrode 42 connect to each other, and a negative potential is applied to a negative electrode Vn where the source electrode S2 of the second power semiconductor element T2 and the first electrode 41 connect to each other. Thus, the power module illustrated in FIG. 19 operates as an inverter module.

In the power module illustrated in FIG. 19, heat generated at the time when the power semiconductor elements operate is radiated via the capacitor structural body of the semiconductor device 1. Moreover, since the electrodes of the capacitor structural body and the electrodes of the power semiconductor elements directly connect to each other, an internal parasitic inductance of the power module is reduced. Therefore, a surge component generated at the time of switching operations of the power semiconductor elements is reduced, and a low-loss power module can be achieved.

Second Embodiment

Figure 21:
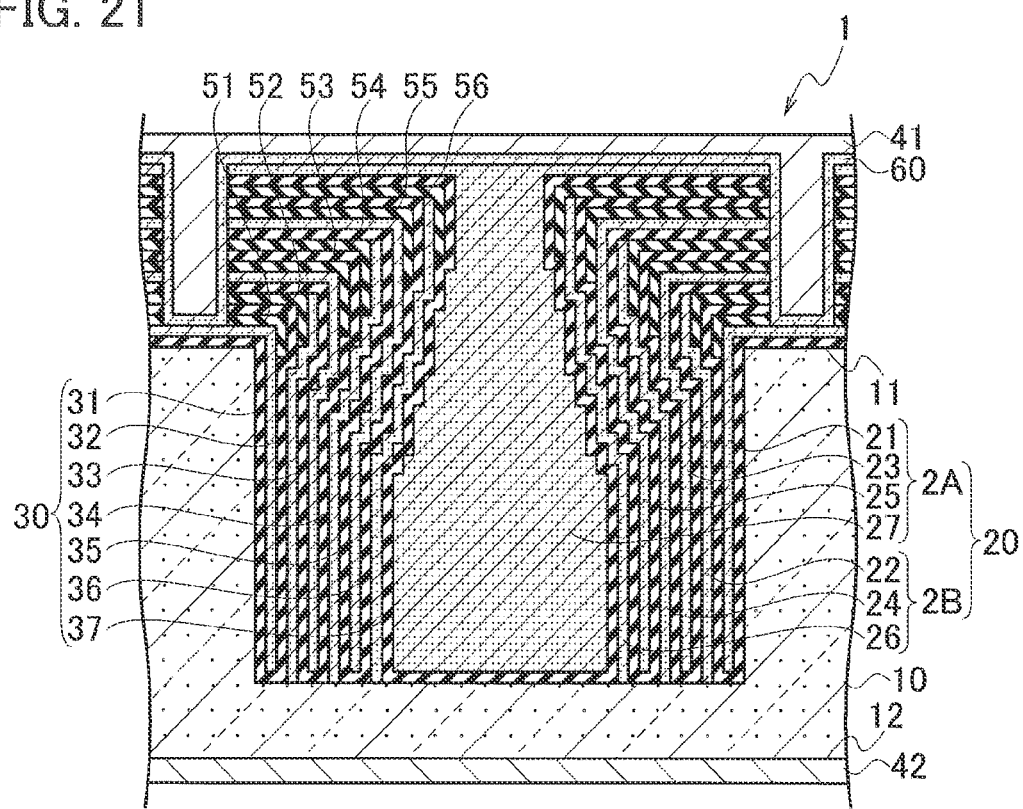
FIG. 21 is a schematic cross-sectional view illustrating a configuration of a semiconductor device according to a second embodiment of the present invention.

FIG. 21 illustrates a semiconductor device 1 according to a second embodiment of the present invention. In the semiconductor device 1 illustrated in FIG. 21, the number of conductive layers 20 and the dielectric layers 30, which are to be formed inside the trench, is larger than those of the semiconductor device 1 illustrated in FIG. 1. Therefore, the capacity of the capacitor structural body to be formed in the semiconductor device 1 can be increased. Other configurations are the same as these of the first embodiment.

In the semiconductor device 1 illustrated in FIG. 21, seven conductive layers 20 and seven dielectric layers 30 are arranged alternately with each other inside the trench. As illustrated in FIG. 21, the conductive layer closest to the side surface of the trench is defined as the first conductive layer, and odd number-th conductive layers electrically connect to one another. The odd number-th conductive layers electrically connect to the first electrode 41. That is, conductive layers 21, 23, 25 and 27 which are the odd number-th conductive layers are the first conductive layers 2A. Meanwhile, even number-th conductive layer a electrically connect to one another, and electrically connect to the second electrode 42 via the semiconductor substrate 10. That is, conductive layers 22, 24 and 26 which are the even number-th conductive layers are the second conductive layers 2B.

As illustrated in FIG. 21, each of the respective layers as the first conductive layers 2A electrically connects to the first electrode 41, which is arranged on the first main surface 11, via the contact film 60, and so on in a region thereof extended on the first main surface 11. The respective layers as the second conductive layers 2B connect to the semiconductor substrate 10 at the bottom portion of the trench, and electrically connect to the second electrode 42, which is arranged on the second main surface 12, via the semiconductor substrate 10. The dielectric layer 31 is arranged between the side surface of the trench and the conductive layer 21, and the dielectric layers 32 to 37 are arranged between the corresponding conductive layers 21 to 27.

As described above, the semiconductor device 1 illustrated in FIG. 21 has a configuration in which seven capacitors are connected in parallel to one another. Hereinafter, an example of a method for manufacturing the semiconductor device 1 according to the second embodiment will be described with reference to the drawings.

Figure 22:
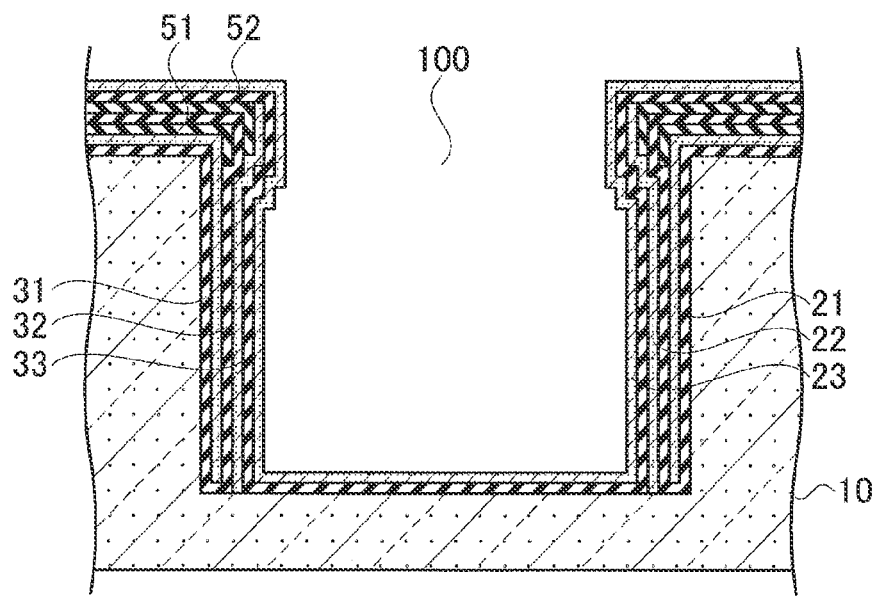
FIG. 22 is a schematic cross-sectional view for explaining a method for manufacturing the semiconductor device according to the second embodiment of the present invention (No. 1).

First, after the conductive layers 21 and 22 and the dielectric layers 31 to 33 are formed inside the trench 100 in a similar way to the method described with reference to FIG. 4 to FIG. 13, the conductive layer 23 is formed so as to cover the dielectric layer 33 as illustrated in FIG. 22.

Figure 23:
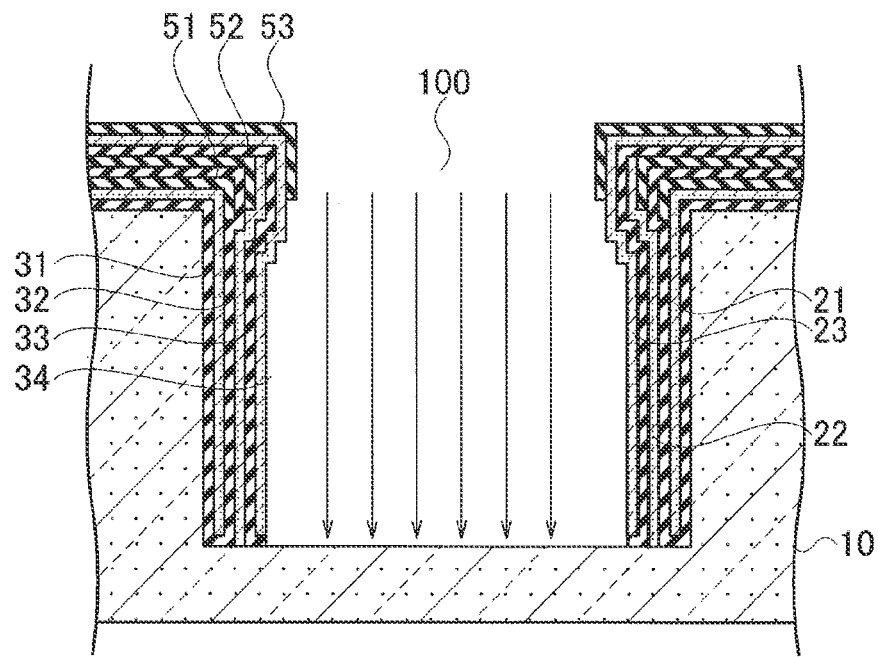
FIG. 23 is a schematic cross-sectional view for explaining the method for manufacturing the semiconductor device according to the second embodiment of the present invention (No. 2).

Next, after an insulating protective film 53 is formed so as to cover the conductive layer 23 formed outside the trench 100, the dielectric layer 33 and the conductive layer 23, which are formed on the bottom portion of the trench 100, are removed by dry etching as illustrated in FIG. 23. Thus, the semiconductor substrate 10 is exposed on the bottom portion of the trench 100. The insulating protective film 53 is formed for the purpose of protecting the conductive layer 23 formed outside the trench 100 in this etching step. For the insulating protective film 53, a silicon oxide film or the like can be used like the other insulating protective films.

Figure 24:
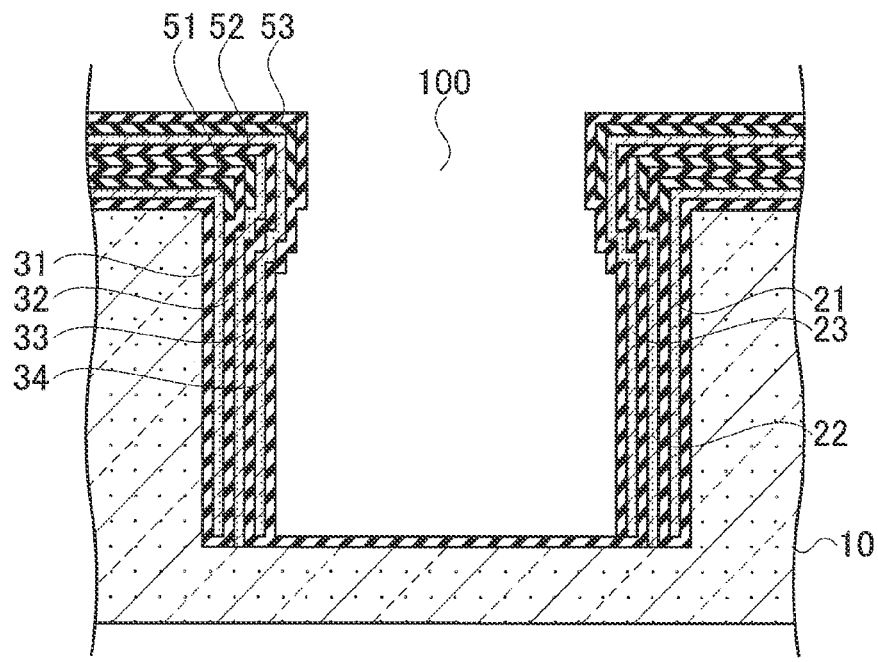
FIG. 24 is a schematic cross-sectional view for explaining the method for manufacturing the semiconductor device according to the second embodiment of the present invention (No. 3).
Figure 25:
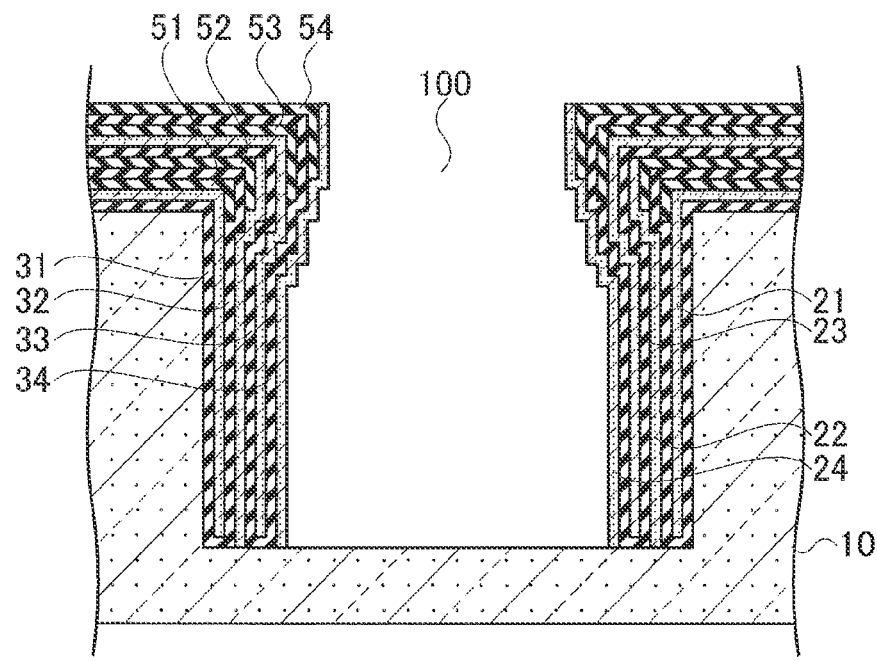
FIG. 25 is a schematic cross-sectional view for explaining the method for manufacturing the semiconductor device according to the second embodiment of the present invention (No. 4).

After the dielectric layer 34 is formed as illustrated in FIG. 24, an insulating protective film 54 is formed so as to cover the dielectric layer 34 outside the trench 100, and the dielectric layer 34 formed on the bottom portion of the trench 100 is removed by etching. Thereafter, the conductive layer 24 is formed, the conductive layer 24 outside the trench 100 and on the bottom portion of the trench 100 is removed by dry etching as illustrated in FIG. 25. At this time, though the conductive layer 24 must not remain outside the trench 100, the conductive layer 24 may remain on the bottom portion of the trench 100.

Figure 26:
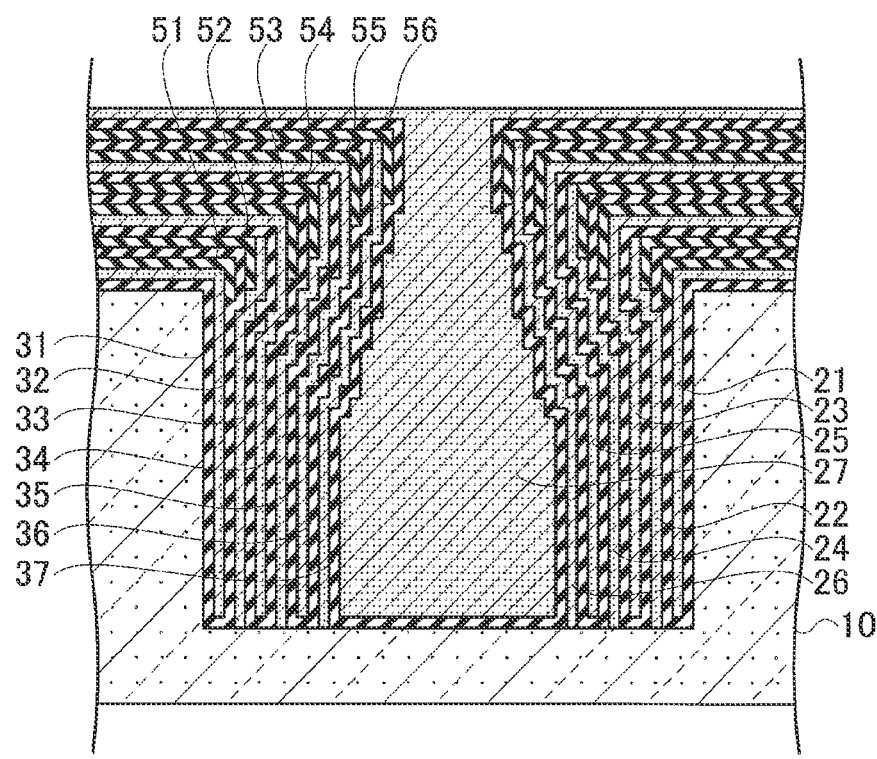
FIG. 26 is a schematic cross-sectional view for explaining the method for manufacturing the semiconductor device according to the second embodiment of the present invention (No. 5).

Thereafter, such steps described with reference to FIG. 22 to FIG. 25 are repeated to form the dielectric layer 35 to 37 and the conductive layers 25 to 27, and a configuration illustrated in FIG. 26 is obtained. Note that, while protecting the conductive layer 20 and the dielectric layer 30, which are formed outside the trench 100, by the insulating protective films 55 and 56, the conductive layers 20 and the dielectric layers 30, which are formed on the bottom portion of the trench 100, are removed.

Figure 27:
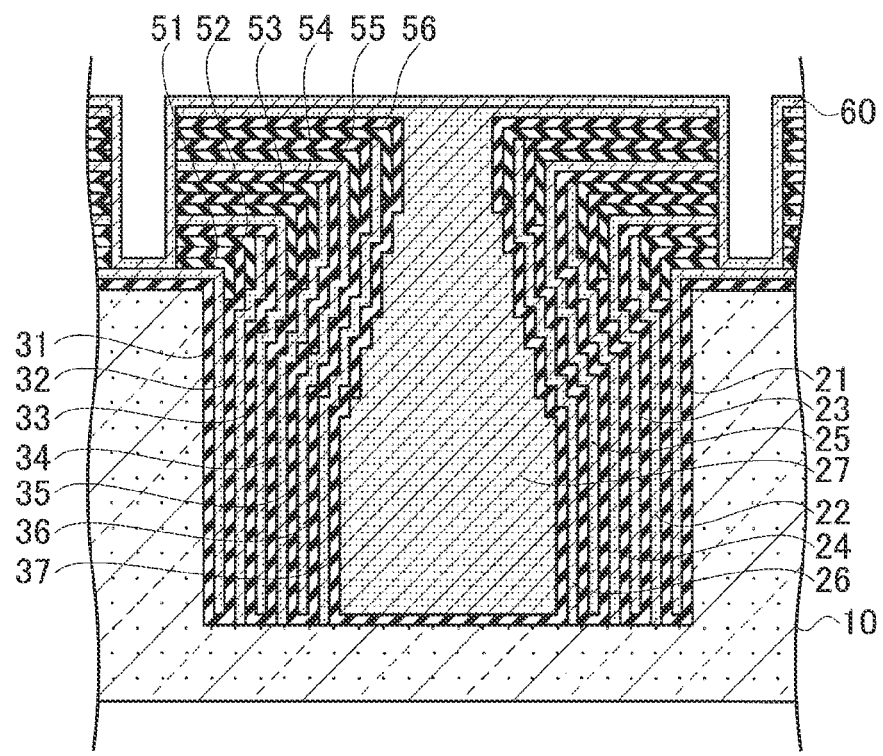
FIG. 27 is a schematic cross-sectional view for explaining the method for manufacturing the semiconductor device according to the second embodiment of the present invention (No. 6).

Thereafter, at predetermined positions outside the trench 100, in the conductive layers 20, the dielectric layers 30 and the insulating protective films 51 to 56, which are arranged on the first main surface 11, contact holes are formed so that an upper surface of the conductive layer 21 is exposed. Then, as illustrated in FIG. 27, a contact film 60 is formed so as to cover inner wall surfaces of the contact holes. The conductive layers 21, 23, 25 and 27 electrically connect to one another by the contact film 60. Thereafter, the first electrode 41 is formed so as to cover the contact film 60 in a manner of embedding the contact holes, and the second electrode 42 is formed on the second main surface 12. Thus, the semiconductor device illustrated in FIG. 21 is completed.

In the above, the example where the seven conductive layers 20 and the seven dielectric layers 30 are laminated on one another is described; however, similar steps to those described above may be repeated, eight or more conductive layers 20 and eight or more dielectric layers 30 may be laminated on one another, and the semiconductor device 1 may be formed to have a configuration in which eight or more capacitors are connected in parallel to one another. The number of conductive layers 20 and the number of dielectric layers 30 are increased, thus making it possible to increase the capacity of the capacitor structural body. Others are substantially similar to those of the first embodiment, and accordingly, a duplicate description will be omitted.

Third Embodiment

Figure 28:
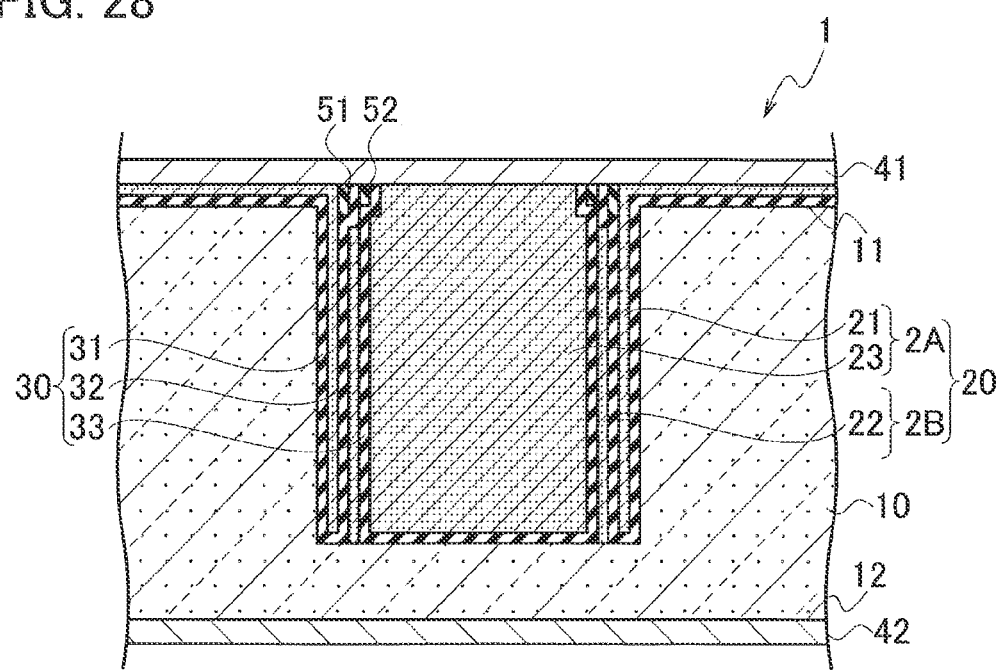
FIG. 28 is a schematic cross-sectional view illustrating a configuration of a semiconductor device according to a third embodiment of the present invention.

In a semiconductor device 1 according to a third embodiment of the present invention, as illustrated in FIG. 28, a position of an upper end of the second conductive layer 2B is more apart from the first main surface 11 than a position of upper ends of the first conductive layers 2A which connect to the first electrode 41 arranged on the first main surface 11. Then, over the entire surface of the first main surface 11, the first electrode 41 and the first conductive layers 2A are directly laminated on each other. That is, the semiconductor device 1 illustrated in FIG. 28 has a configuration equivalent to that in the case where the contact holes 120 of the semiconductor device 1 illustrated in FIG. 1 are formed on the entire surface of the first main surface 11. In the semiconductor device 1 illustrated in FIG. 28, the dielectric layers 30 and the insulating protective films 51 and 52 are not arranged above the conductive layers 20 in the first main surface 11 outside the trench. Other configurations are the same as those of the first embodiment.

In the semiconductor device 1 illustrated in FIG. 28, the first electrode 41 and the first conductive layers 2A electrically connect to each other on the entire surface of the first main surface 11. Therefore, the ESR of the capacitor structural body can be reduced. Moreover, the patterning step for forming the contact holes 120 on the first main surface 11 is omitted, and the manufacturing process can be shortened.

Figure 29:
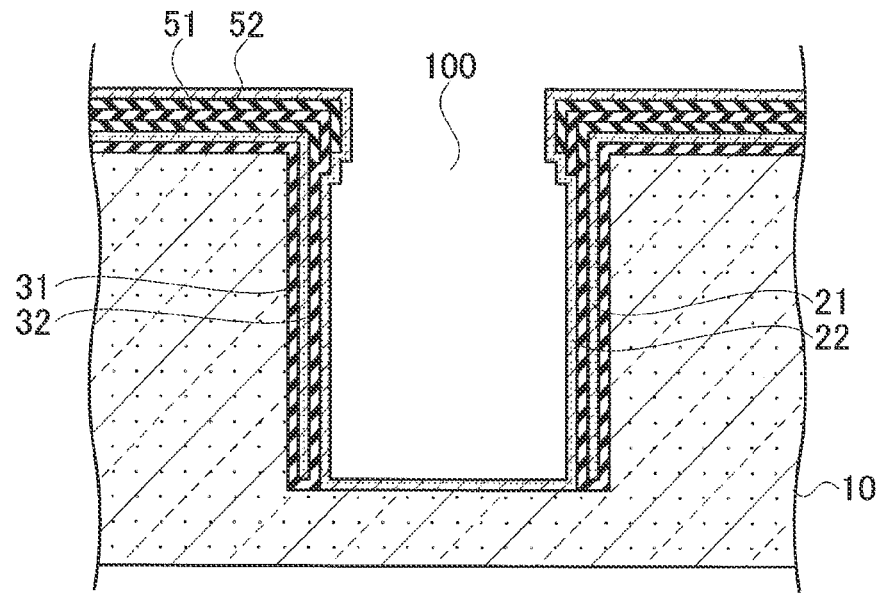
FIG. 29 is a schematic cross-sectional view for explaining a method for manufacturing the semiconductor device according to the third embodiment of the present invention (No. 1).

Hereinafter, a method for manufacturing the semiconductor device 1 illustrated in FIG. 28 will be described with reference to the drawings. First, as illustrated in FIG. 29, the dielectric layer 31, the conductive layer 21, the dielectric layer 32 and the conductive layer 22 are laminated on the side surface of the trench 100 in a similar way to the method described with reference to FIG. 4 to FIG. 11.

Figure 30:
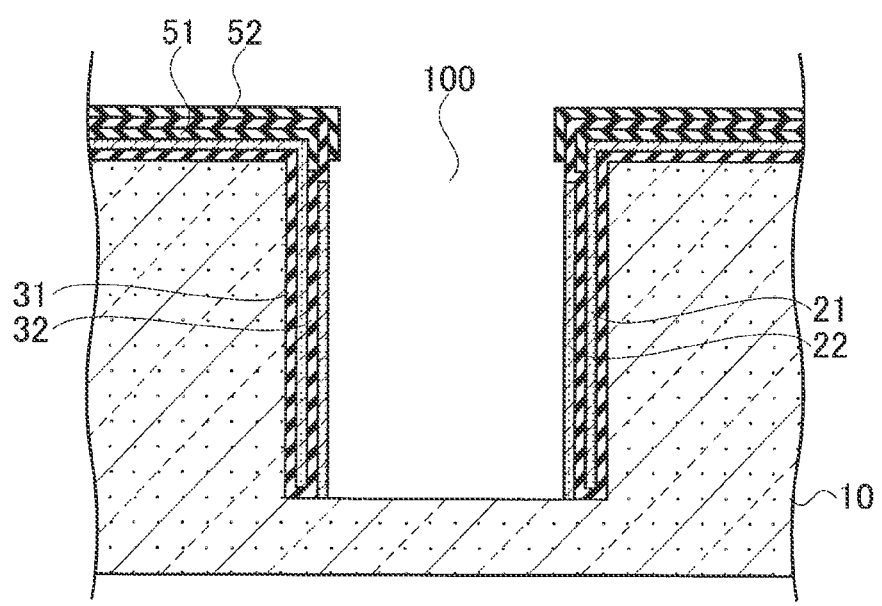
FIG. 30 is a schematic cross-sectional view for explaining the method for manufacturing the semiconductor device according to the third embodiment of the present invention (No. 2).

Next, the conductive layer 22 formed on the bottom portion of the trench 100 is removed by dry etching. At this time, as illustrated in FIG. 30, a position of an upper end of the conductive layer 22 is set to be lower than a position of an upper end of the conductive layer 21.

Figure 31:
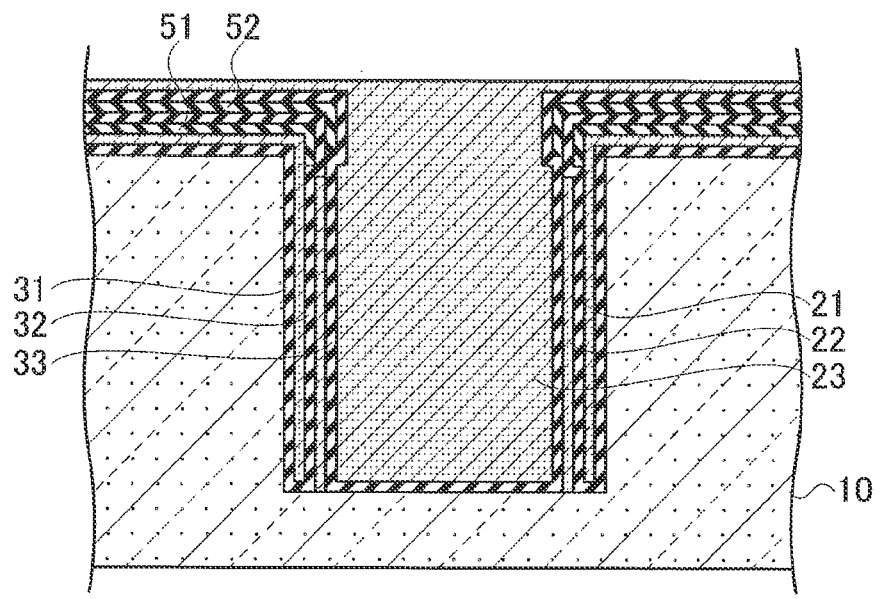
FIG. 31 is a schematic cross-sectional view for explaining the method for manufacturing the semiconductor device according to the third embodiment of the present invention (No. 3).
Figure 32:
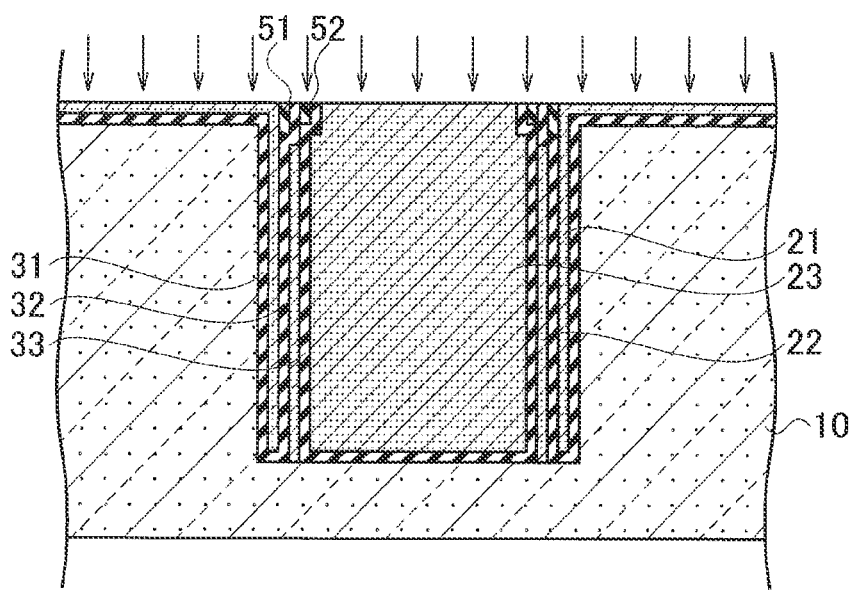
FIG. 32 is a schematic cross-sectional view for explaining the method for manufacturing the semiconductor device according to the third embodiment of the present invention (No. 4).

Subsequently, as illustrated in FIG. 31, the dielectric layer 33 and the conductive layer 23 are formed in sequence, and embed the inside of the trench 100. Then, as illustrated in FIG. 32, the entire surface of the first main surface 11 of the semiconductor substrate 10 is etched by dry etching, and the conductive layers 21 and 23 are exposed on the first main surface 11.

Thereafter, the first, electrode 41 is formed on the first main surface 11, and the second electrode 42 is formed on the second main surface 12. In such a way as described above, the semiconductor device 1 illustrated in FIG. 28 is completed.

Other Embodiments

As above, the embodiments of the present invention have been described; however, it should not be understood that the description and the drawings, which form a part of this disclosure, limit the present invention. For those skilled in the art, varieties of alternative embodiments, examples and application technologies will be obvious from this disclosure.

For example, in the above, the example where the first conductive layers 2A and the second conductive layer 2B are arranged alternately with one another is illustrated; however, the arrangement of the conductive layers 20 is not limited to this configuration. For example, there may be a portion where one of the first conductive layers 2A and another of the first conductive layers 2A are made adjacent to each other with the dielectric layers 30 interposed therebetween. Alternatively, there may be a portion where one of the second conductive layers 2B and another of the second conductive layers 2B are made adjacent to each other with the dielectric layers 30 interposed therebetween.

Moreover, the second conductive layer 2B may electrically connect to the semiconductor substrate 10 on not only the bottom portion of the trench but also the side surface of the trench.

Note that, though the example where the second electrode 42 is disposed on the second main surface 12 of the semiconductor substrate 10 is illustrated, the second electrode 42 may be arranged on the first main surface 11 of the semiconductor substrate 10. The resistivity of the semiconductor substrate 10 is reduced, whereby the ESR in the ease of using the semiconductor substrate 10 as a current path can be made smaller in comparison with the ease of using, as a current path, the conductive layers formed inside the trench as in the semiconductor device of the comparative example, which is illustrated in FIG. 2.

Moreover, though the description is given of the case where the conductive layers 20 are polycrystalline silicon films, the conductive layers 20 may be other conductive semiconductor films or metal films. For example, for the material of the conductive layers 20, conductive polycrystalline silicon carbide, silicon germanium (SiGe), aluminum and the like may be used. Furthermore, for the step of etching the conductive layers 20 and the dielectric layers 30, not the dry etching but wet etching using hydrofluoric acid or hot phosphoric acid may be used.

In the above, illustrated is the example of constituting the inverter module by combining the semiconductor device 1 and the power semiconductor element with each other; however, the power module using the semiconductor device 1 is not limited to the inverter module. A smaller capacitor element can be provided to the semiconductor device 1, and accordingly, a size of the power module can be reduced by applying the semiconductor device 1 to the power module.

INDUSTRIAL APPLICABILITY

The semiconductor device, the power module and the method for manufacturing the semiconductor device in the present invention are usable for the electronic device industry including manufacturers which manufacture a semiconductor device in which a semiconductor capacitor is configured on a semiconductor substrate.

REFERENCE SIGNS LIST

1 Semiconductor device
10 Semiconductor substrate
11 First main surface
12 Second main surface
21 to 27 Conductive layer
2A First conductive layer
2B Second conductive layer
31 to 37 Dielectric layer
41 First electrode
42 Second electrode
51 to 56 Insulating protective film
100 Trench
200 Insulator
300 Cooling device
T1 First power semiconductor element
T2 Second power semiconductor element

The invention claimed is:

1. A semiconductor device comprising:
a semiconductor substrate having first and second main surfaces facing each other, in which a trench is formed on the first main surface, wherein an entirety of the semiconductor substrate is conductive;
a plurality of conductive layers, each of which is either a first conductive layer or a second conductive layer, the conductive layers being laminated on one another along a side surface of the trench in a direction that is normal to the side surface of the trench;
dielectric layers arranged between a conductive layer closest to the side surface of the trench among the plurality of conductive layers and the side surface of the trench, and between the plurality of corresponding conductive layers;
a first electrode that is arranged outside the trench and electrically connects to the first conductive layer outside the trench in plan view, the first electrode physically contacting the first conductive layer; and
a second electrode that is arranged on the second main surface of the semiconductor substrate and electrically connects to the second conductive layer via the semiconductor substrate,
wherein the first conductive layer is electrically insulated from the semiconductor substrate,
wherein the semiconductor substrate that electrically connects to the second conductive layer inside the trench electrically connects to the second electrode, and
wherein the first conductive layer includes one first conductive layer and another first conductive layer, the first electrode extending only through the one first conductive layer, of the first conductive layer, in a contact hole, the contact hole being laterally adjacent the trench in plan view.

2. The semiconductor device according to claim 1, wherein the trench is embedded with a laminated structure of the plurality of conductive layers and the dielectric layers.

3. The semiconductor device according to claim 1, wherein four or more conductive layers including the first conductive layer and the second conductive layer are provided.

4. The semiconductor device according to claim 1,
wherein the conductive layer closest to the side surface of the trench among the plurality of conductive layers is defined as a first conductive layer,
wherein odd number-th conductive layers in the plurality of conductive layers electrically connect to one another, and
wherein even number-th conductive layers in the plurality of conductive layers electrically connect to one another.

5. The semiconductor device according to claim 1, wherein the dielectric layers have a structure in which a plurality of dielectric films made of materials different from one another are laminated on one another.

6. The semiconductor device according to claim 1, further comprising a cooling device disposed so as to face at least either the first main surface of the semiconductor substrate or the second main surface of the semiconductor substrate.

7. The semiconductor device according to claim 1, wherein the semiconductor substrate is a single crystal silicon substrate.

8. The semiconductor device according to claim 1, wherein the semiconductor substrate is a polycrystalline silicon substrate.

9. The semiconductor device according to claim 1, wherein the dielectric layers include at least either silicon oxide films or silicon nitride films.

10. A power module comprising:
the semiconductor device according to claim 1,
a first power semiconductor element in which a drain electrode connects to the second electrode; and a second power semiconductor element in which a source electrode connects to the first electrode,
wherein a source electrode of the first power semiconductor element and a drain electrode of the second power semiconductor element electrically connect to each other.

* * * * *